United States Patent
Tang et al.

(10) Patent No.: US 7,674,684 B2
(45) Date of Patent: Mar. 9, 2010

(54) DEPOSITION METHODS FOR RELEASING STRESS BUILDUP

(75) Inventors: Jing Tang, Santa Clara, CA (US); Nitin K. Ingle, Santa Clara, CA (US); Zheng Yuan, Fremont, CA (US); Rossella Mininni, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/178,051

(22) Filed: Jul. 23, 2008

(65) Prior Publication Data

US 2010/0022067 A1    Jan. 28, 2010

(51) Int. Cl.
  *H01L 21/76* (2006.01)
(52) U.S. Cl. ............... 438/424; 438/435; 257/E21.546
(58) Field of Classification Search ................ 438/424, 438/435; 257/E21.546
  See application file for complete search history.

(56) References Cited

U.S. PATENT DOCUMENTS

| 6,429,136 | B2 * | 8/2002 | Miwa ........................ 438/692 |
| 6,576,487 | B1 * | 6/2003 | Wang et al. ................... 438/17 |
| 7,361,572 | B2 * | 4/2008 | Chen et al. ................... 438/435 |
| 2003/0087497 | A1 * | 5/2003 | Yoo et al. ..................... 438/311 |
| 2004/0142534 | A1 * | 7/2004 | Yoo et al. ..................... 438/311 |
| 2005/0233524 | A1 * | 10/2005 | Lee ............................. 438/264 |
| 2006/0105541 | A1 * | 5/2006 | Inoue ......................... 438/452 |
| 2006/0151855 | A1 * | 7/2006 | Kiyotoshi et al. ........... 257/618 |
| 2007/0298585 | A1 | 12/2007 | Lubomirsky et al. |
| 2009/0004849 | A1 * | 1/2009 | Eun ............................ 438/654 |
| 2009/0068816 | A1 * | 3/2009 | Eun ............................ 438/425 |
| 2009/0098740 | A1 * | 4/2009 | Kim et al. ................... 438/782 |

* cited by examiner

*Primary Examiner*—Charles D Garber
*Assistant Examiner*—Stanetta D Isaac
(74) *Attorney, Agent, or Firm*—Townsend and Townsend and Crew LLP (57) ABSTRACT

A deposition method for releasing a stress buildup of a feature over a semiconductor substrate with dielectric material is provided. The feature includes lines separated by a gap. The method includes forming a liner layer over the feature on the semiconductor substrate in a chamber. A stress of the liner layer over the feature is released to substantially reduce bending of the lines of the feature. A dielectric film is deposited over the stress-released liner layer to substantially fill the gap of the feature.

18 Claims, 5 Drawing Sheets

DEPOSITION METHODS FOR RELEASING STRESS BUILDUP

FIELD OF THE INVENTION

The invention relates to methods for semiconductor manufacturing. More particularly, the invention relates to gapfill methods for reducing bending effect of semiconductor structures.

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulation material to isolate the elements both physically and electrically. As circuit densities increase, however, the widths of these gaps decrease, increase their aspect ratios and making it progressively more difficult to fill the gaps without leaving voids. The formation of voids when the gap is not filled completely is undesirable because they may adversely affect operation of the completed device, such as by trapping impurities within the insulation material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

In some instances where gaps have a large aspect ratio and narrow width, gaps have been filled with thermal CVD techniques using a "dep/etch/dep" process by sequentially depositing material, etching some of it back, and depositing additional material. The etching step acts to reshape the partially filled gap, opening it so that more material can be deposited before it closes up and leaves an interior gap. Such dep/etch/dep processes have also been used with PECVD techniques, but some thermal and PECVD techniques are still unable to fill gaps having very large aspect ratios even by cycling deposition and etching steps.

Dep/etch/dep processes have also been shown to improve gapfill in HDP-CVD processes. Originally, the application of dep/etch/dep processes to HDP-CVD was considered counterintuitive because, unlike PECVD processes, the high density of ionic species in the plasma during HDP-CVD processes already causes there to be sputtering of a film while it is being deposited. This simultaneous sputtering and deposition of material during a deposition process tends to keep the gap open during deposition, and was therefore believed to render a separate intermediate etching step superfluous.

Conventionally, prior to filling a gapfill dielectric material in gaps of a semiconductor substrate, a liner layer is formed. The liner layer is a stress layer. It is found that if the dimensions of lines of shallow trench isolation (STI) structures keep shrinking, the liner layer may bend the lines of STI structures to seal a gap between two adjacent lines of STI structures. If the gaps of STI structures are sealed, the dep/etch/dep processes cannot provide a gapfill material within the gaps for isolation. The bending effect can be found even worse if the lines of STI structures have a aspect ratio higher than about 10:1. As the trend towards more densely packed devices continues, it will be desirable to find new methods of depositing dielectric materials into the gaps that can accommodate their increasing aspect ratios.

BRIEF SUMMARY OF THE INVENTION

Embodiments of the invention pertain to methods for releasing a stress of a liner layer formed over a feature of a semiconductor structure. The stress release of the liner layer can desirably reduce the bending effect of lines of the feature that may result in sticking of the lines. By reducing the bending effect of the lines, a gapfill material can be desirably filled within gaps of the feature.

One embodiment of the invention provides a deposition method for releasing a stress buildup of a feature over a semiconductor substrate with dielectric material. The feature includes lines separated by a gap. The method includes forming a liner layer over the feature on the semiconductor substrate in a chamber. A stress of the liner layer over the feature is released to substantially reduce bending of the lines of the feature. A dielectric film is deposited over the stress-released liner layer to substantially fill the gap of the feature.

BRIEF DESCRIPTION OF THE DRAWINGS

A further understanding of the nature and advantages of the invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

The invention relates to methods for semiconductor manufacturing. More particularly, the invention relates to gapfill methods for reducing bending effect of semiconductor structures. The method may include forming a liner layer over a feature over a semiconductor structure. Prior to filling a gapfill material in gaps of the feature, the method releases a stress of the liner layer formed over the feature. The feature can include lines with a width of about 40 nm or less and/or have an aspect ratio of about 10 or more. The stress release of the liner layer can desirably reduce the bending effect of lines of the feature that may stick the lines of the feature. By reducing the bending effect of the lines, the gapfill material can be desirably filled within gaps of the feature.

Figure 1:
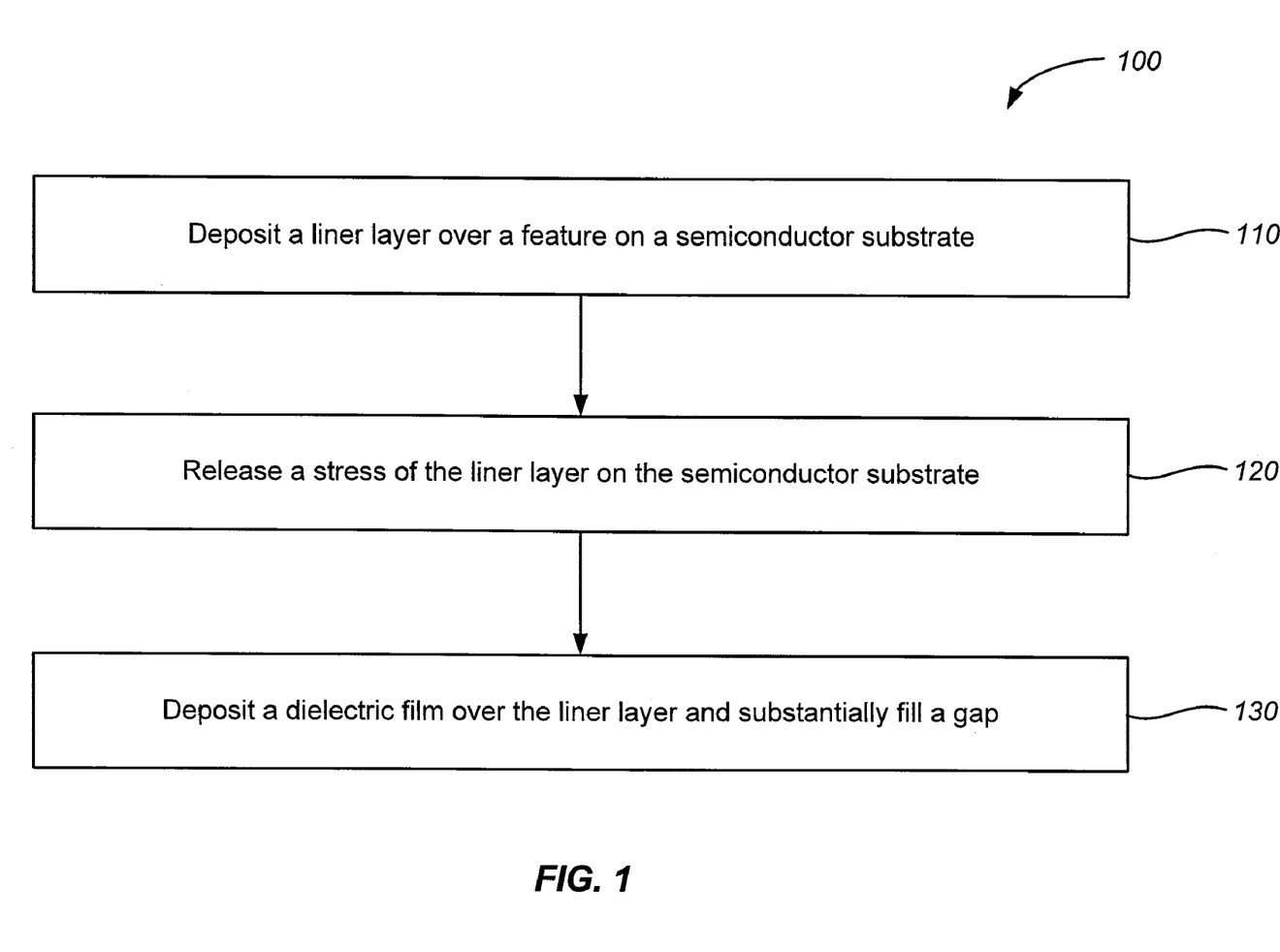
FIG. 1 is a flowchart illustrating an exemplary deposition method according to the invention.

FIG. 1 is a flowchart illustrating a deposition method according to an embodiment of the invention. In FIG. 1, method 100 includes step 110 for depositing a liner layer over a feature on a semiconductor substrate. The feature can be, for example, a shallow trench isolation (STI) structure, a plurality of gate lines, a plurality of conductive lines, or other semiconductor structure. For example, the feature includes lines separated by a gap. In embodiments using STI structure, the lines can be active regions separated by a trench. The liner layer can be, for example, an oxide layer, a nitride layer, an oxy-nitride layer or the like. In embodiments, the liner layer can be made from tetra-ethyl-ortho-silicate (TEOS). The liner layer can be substantially conformal over the feature of the semiconductor substrate. In one embodiment, the liner layer can be formed by a high aspect ratio process (HARP) system, an eHAPR system, or other chemical vapor deposition (CVD) system. In another embodiment, the liner layer can be formed on the feature by, for example, a rapid thermal process in an oxide/oxinitride atmosphere.

For example, the feature can be a STI structure including trenches to provide isolation between active regions of a semiconductor structure. The liner layer having a tensile stress can be deposited over the STI structure. The stress can be between about 50 MPa and about 500 MPa and may bend lines of the STI structure. The deposition of the liner layer can include the use of a HARP which may include using an $O_3$/TEOS based sub-atmospheric chemical vapor deposition (SACVD) process. Though merely showing a liner layer is deposited over the semiconductor substrate, the scope of the invention is not limited thereto. Multiple liner layers can be formed over the substrate.

In FIG. 1, method 100 can include step 120 for releasing the stress of the liner layer over the feature of the semiconductor substrate. In one embodiment, step 120 for releasing the stress of the liner layer can include idling the liner layer over the substrate in the deposition chamber. That is, the liner layer deposition process (step 110) and the stress-release process (step 120) can be performed in the same deposition chamber. The deposition chamber can have a chamber temperature, for example, between about 450° C. and about 550° C. In another embodiment, the stress-release process (step 120), which idles the liner layer can be performed in an apparatus or equipment different from the deposition chamber for step 110. In still another embodiment, step 120 can include annealing the liner layer with a temperature from about a room temperature to about 1,000° C. for a predetermined annealing time. The annealing time decreases with the increase of the annealing temperature. The annealing process can be, for example, a thermal process, a plasma treatment, and/or other process that can desirably release the stress of the liner layer. The liner layer can be exposed to an atmosphere including nitrogen, oxygen, air and/or inert gas. One of ordinary skill in the art, based on the embodiments of the invention, can modify the annealing time and annealing process to desirably release the stress of the liner layer.

After the stress-release process (step 120) for releasing the stress of the liner layer, at least one dielectric film is deposited over the liner layer and substantially fills a gap of the feature (step 130). The dielectric film can be, for example, a gapfill material or flowable dielectric material that can be desirably filled in the gap of the feature. The gapfill dielectric material can be, for example, oxide, nitride, oxynitride, or the like that is less solid than the liner layer before any annealing process. In embodiments, the gapfill dielectric material may be a silicon oxide type dielectric formed from the reaction of oxygen-containing and silicon-containing precursors. For example, an oxide dielectric may be formed from the reaction of remotely generated radical atomic oxygen (i.e., the oxygen-containing precursor) and an organo-silicon precursor (i.e., the silicon-containing precursor). Additional details and examples of methods of depositing gapfill dielectric compositions may be found in co-assigned U.S. patent application Ser. No. 11/549,930, filed Oct. 16, 2006, and titled "FORMATION OF HIGH QUALITY DIELECTRIC FILMS OF SILICON DIOXIDE FOR STI: USAGE OF DIFFERENT SILOXANE-BASED PRECURSORS FOR HARP II—REMOTE PLASMA ENHANCED DEPOSITION PROCESSES"; and U.S. patent application Ser. No. 11/754,440, filed May 29, 2007, and titled "CHEMICAL VAPOR DEPOSITION OF HIGH QUALITY FLOW-LIKE SILICON DIOXIDE USING A SILICON CONTAINING PRECURSOR AND ATOMIC OXYGEN" of which the entire contents of both applications are herein incorporated by reference for all purposes.

In embodiments, multiple gapfill materials are formed to substantially fill the gaps of the semiconductor substrate. For example, a dep/etch/dep process can be provided for filling the gap of the feature. The dep/etch/dep process can be repeated more than one times to substantially fill the gaps of the semiconductor substrate. One of ordinary skill in the art can modify the exemplary embodiments of the application by adding annealing and/or other processes to fill the gaps of the semiconductor substrate.

Figure 2:
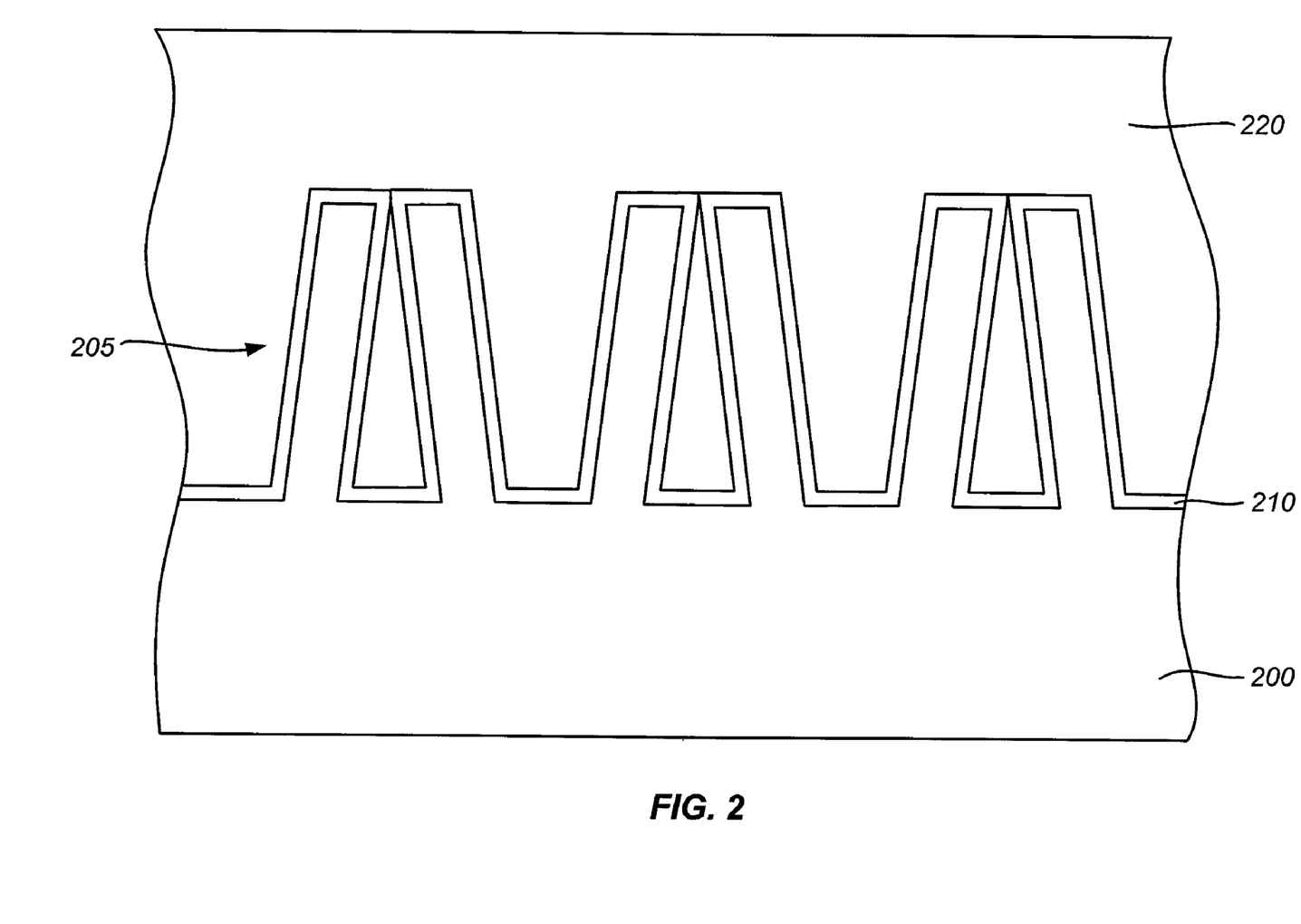
FIG. 2 is a schematic cross-sectional view showing a bending phenomenon of a STI structure without releasing a stress of a liner layer.

It is found that lines of the feature having a line width of about 40 nm or less and an aspect ratio of about 10 or more are vulnerable by the stress of the liner layer as shown in FIG. 2. FIG. 2 is a schematic cross-sectional view showing a bending phenomenon of a STI structure which is caused by a stress of a liner layer. The bending effect caused by the stress of the liner layer may not be serious if the aspect ratio of the lines is less than about 10. The bending effect may also not be serious if the width of the lines is larger than about 40 nm.

In FIG. 2, a liner layer 210 is deposited over a STI structure 205 over semiconductor substrate 200. Liner layer 210 can have a stress between about 50 MPa and about 500 MPa, for example. Without substantially releasing the stress of liner layer 210, the stress of liner layer 210 can bend the lines of STI structure 205. In some situations, the stress of liner layer 210 may adversely bend the lines of STI structure 205, such that the lines are stuck to each other. Due to the bending effect, a subsequent gapfill dielectric material 220 can not be filled in the gap between the stuck lines of STI structure 205. Accordingly, voids and/or seams are formed within STI structure 205.

Figure 3:
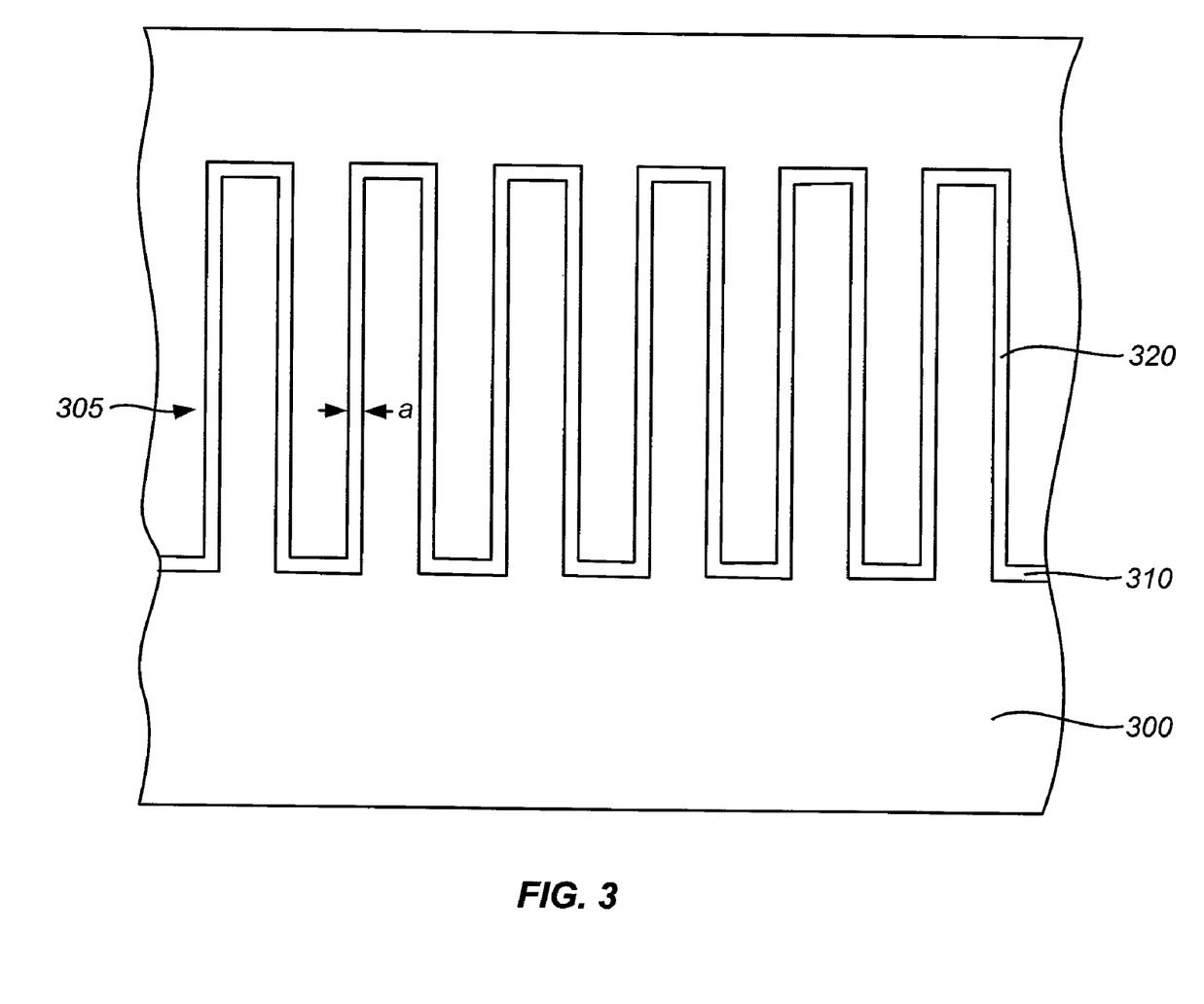
FIG. 3 is a simplified cross-sectional view of an exemplary STI structure with a stress-release step according to an embodiment of the invention.

As described above in conjunction with FIG. 1, the stress-release process (step 120) can desirably release the stress of the liner layer so as to substantially reduce the bending effect prior to filling a gapfill dielectric material. FIG. 3 is a simplified cross-sectional view of an exemplary STI structure after the stress-release of the liner layer according to an embodiment of the invention. In FIG. 3, a liner layer 310 disposed over a STI structure 305 over a semiconductor structure 300. After depositing liner layer 310, the stress-release process (step 120 shown in FIG. 1) is applied to liner layer 310. The stress-release process can desirably release the stress of liner layer 310, such that the lines of STI structure 305 are not substantially bended and/or stuck to each other by the stress of liner layer 310. By substantially reducing the bending effect, gapfill dielectric material 320 can be desirably filled within the gaps between the lines of STI structure 305. It is noted that the stress-release process (step 120) is performed before the deposition of gapfill dielectric material 320 so as to desirably reduce the bending effect. In embodiments, liner layer 310 has a stress larger than that of gapfill dielectric material 320. As shown in FIG. 3, liner layer 310 is deposited substantially conformal over STI structure 305. In embodiments, liner layer 310 can have a thickness "a" from about 2 nm to about 10 nm on sidewalls of STI structure 305. One of ordinary skill in the art can modify the thickness of the liner layer on the sidewalls of the STI structure based on different generation techniques used to manufacture the STI structure.

Deposition systems that may implement embodiments of the invention may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, PRODUCER™ SACVD chambers/systems, and PRODUCER™ PECVD chambers/systems, available from Applied Materials, Inc. of Santa Clara, Calif.

Figure 4A:
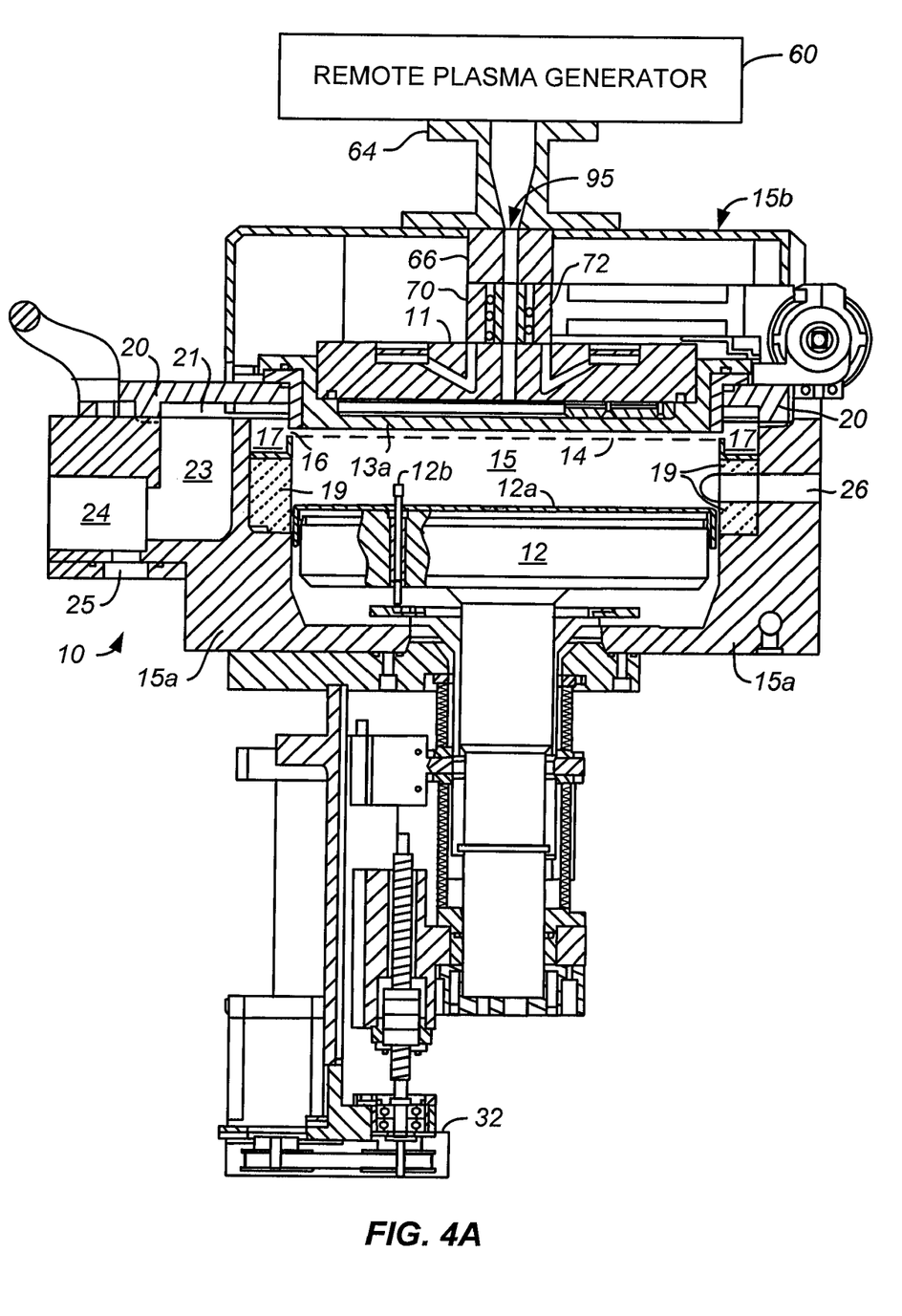
FIG. 4A is a simplified cross-sectional view of an exemplary CVD system accordingly to embodiments of the invention.

One suitable substrate processing system in which can be modified to utilize embodiments in accordance with the invention is shown and described in co-assigned U.S. Pat. Nos. 6,387,207 and 6,830,624, which are incorporated herein by reference for all purposes. FIG. 4A is a cross-sectional view of CVD system 10, having vacuum or processing chamber 15 that includes chamber wall 15a and chamber lid assembly 15b.

CVD system 10 contains gas distribution manifold 11 for dispersing process gases to a substrate (not shown) that rests on heated pedestal 12 centered within process chamber 15. Gas distribution manifold 11 can be formed from an electrically conducting material in order to serve as an electrode for forming a capacitive plasma. During processing, the substrate (e.g. a semiconductor wafer) is positioned on flat (or slightly convex) surface 12a of pedestal 12. Pedestal 12 can be moved controllably between a lower loading/off-loading position (depicted in FIG. 4A) and an upper processing position 14 (indicated by dashed line in FIG. 4A), which is closely adjacent to manifold 11. A centerboard (not shown) includes sensors for providing information on the position of the wafers.

Deposition and carrier gases are introduced into chamber 15 through perforated holes 13b of conventional flat, circular gas distribution faceplate 13a. More specifically, deposition process gases flow into the chamber through inlet manifold 11, through a conventional perforated blocker plate and then through holes in gas distribution faceplate 13a.

Prior to reaching manifold 11, deposition and carrier gases are input from gas sources through gas supply lines into a mixing system where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, a RF power supply applies electrical power between gas distribution faceplate 13a and pedestal 12 so as to excite the process gas mixture to form a plasma within the cylindrical region between faceplate 13a and pedestal 12. (This region will be referred to herein as the "reaction region"). Constituents of the plasma react to deposit a desired film on the surface of the semiconductor wafer supported on pedestal 12. The RF power supply is a mixed frequency RF power supply that typically supplies power at a high RF frequency (RF1) of 13.56 MHz and at a low RF frequency (RF2) of 360 KHz to enhance the decomposition of reactive species introduced into vacuum chamber 15. In a thermal process, the RF power supply would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats entire process chamber 10, including the walls of chamber body 15a surrounding exhaust passageway 23 and shut-off valve 24. When the plasma is not turned on or during a thermal deposition process, a hot liquid is circulated through walls 15a of process chamber 15 to maintain the chamber at an elevated temperature. The passages in the remainder of chamber walls 15a are not shown. Fluids used to heat chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from chamber 15 by a vacuum pump (not shown). Specifically, the gases are exhausted through an annular, slot-shaped orifice 16 surrounding the reaction region and into annular exhaust plenum 17. Annular slot 16 and plenum 17 are defined by the gap between the top of chamber's cylindrical side wall 15a (including upper dielectric lining 19 on the wall) and the bottom of circular chamber lid 20. The 360-degree circular symmetry and uniformity of slot orifice 16 and plenum 17 are important to achieve a uniform flow of process gases over the wafer so as to deposit a uniform film on the wafer.

From exhaust plenum 17, the gases flow underneath lateral extension portion 21 of exhaust plenum 17, past a viewing port (not shown), through downward-extending gas passage 23, past vacuum shut-off valve 24 (whose body is integrated with lower chamber wall 15a), and into exhaust outlet 25 that connects to the external vacuum pump (not shown) through a foreline (also not shown).

The wafer support platter of pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of pedestal 12.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

Lift mechanism and motor 32 (FIG. 4A) raises and lowers heater pedestal assembly 12 and its wafer lift pins 12b as wafers are transferred into and out of the body of chamber 15 by a robot blade (not shown) through insertion/removal opening 26 in the side of chamber 10. Motor 32 raises and lowers pedestal 12 between processing position 14 and a lower, wafer-loading position. The motor, valves or flow controllers connected to the supply lines, gas delivery system, throttle valve, RF power supply, and chamber and substrate heating systems are all controlled by a system controller over control lines, of which only some are shown. A controller relies on feedback from optical sensors to determine the position of movable mechanical assemblies such as the throttle valve and susceptor which are moved by appropriate motors under the control of the controller.

In the exemplary embodiment, the system controller includes a hard disk drive (memory), a floppy disk drive and a processor. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

A system controller controls all of the activities of the CVD machine. The system controller executes system control software, which is a computer program stored in a computer-readable medium such as a memory. Preferably, the memory is a hard disk drive, but the memory may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate the controller.

A process for depositing a film on a substrate or a process for cleaning chamber 15 can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 4B:
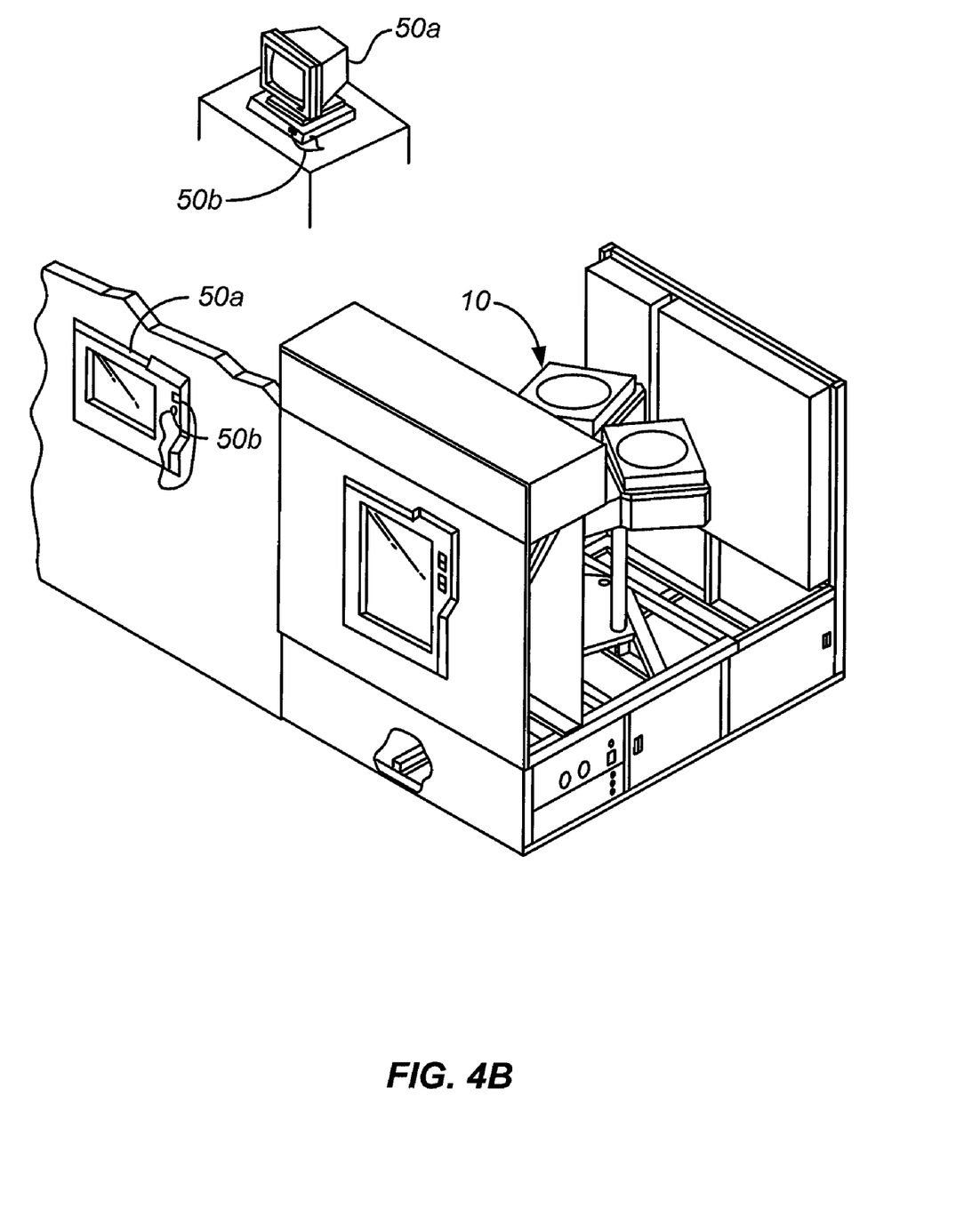
FIG. 4B is a simplified diagram of a system monitor/controller component of a substrate processing system according to embodiments of the invention.

The interface between a user and the controller is via a CRT monitor 50a and light pen 50b, shown in FIG. 4B, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. Monitors 50a simultaneously display the same information, but only one light pen 50b is enabled. A light sensor in the tip of light pen 50b detects light emitted by CRT display. To select a particular screen or function, the operator touches a designated area of the display screen and pushes the button on pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with the controller.

FIG. 4A shows remote plasma generator 60 mounted on lid assembly 15b of process chamber 15 including gas distribution faceplate 13a and gas distribution manifold 11. Mounting adaptor 64 mounts remote plasma generator 60 on lid assembly 15b, as best seen in FIG. 4A. Adaptor 64 is typically made of metal. Passageway 95 is configured between adaptor 64 and lid assembly 15b. Mixing device 70 is coupled to the upstream side of gas distribution manifold 11 (FIG. 4A). Mixing device 70 includes mixing insert 72 disposed inside a slot of a mixing block for mixing process gases. Ceramic isolator 66 is placed between mounting adaptor 64 and mixing device 70 (FIG. 4A). Ceramic isolator 66 may be made of a ceramic material such as $Al_2O_3$ (99% purity), Teflon®, or the like. When installed, mixing device 70 and ceramic isolator 66 may form part of the lid assembly 15b. Isolator 66 isolates metal adaptor 64 from mixing device 70 and gas distribution manifold 11 to minimize the potential for a secondary plasma to form in lid assembly 15b as discussed in more detail below. A three-way valve controls the flow of the process gases to process chamber 15 either directly or through remote plasma generator 60.

Remote plasma generator 60 is desirably a compact, self-contained unit that can be conveniently mounted on lid assembly 15b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as NF3 and a carrier gas such as argon to generate free fluorine which is used to clean film deposits in process chamber 15.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise", "comprising", "include", "including", and "includes" when used in this specification and in the following claims are intended to specify the presence of stated features, integers, components, or steps, but they do not preclude the presence or addition of one or more other features, integers, components, steps, acts, or groups.

What is claimed is:

1. A deposition method for releasing a stress buildup of a feature over a semiconductor substrate with dielectric material, the feature including lines separated by a gap, the method comprising:
    forming a liner layer over the feature on the semiconductor substrate in a chamber;
    releasing a stress of the liner layer over the feature by idling the liner layer in the chamber at a temperature of between about 450° C. to about 550° C. to substantially reduce bending of the lines of the feature; and
    depositing a dielectric film over the stress-released liner layer to substantially fill the gap of the feature.

2. The deposition method of claim 1 wherein releasing the stress of the liner layer includes idling the liner layer in the chamber for a predetermined time.

3. The deposition method of claim 1 wherein releasing the stress of the liner layer includes annealing the liner layer with a temperature from about a room temperature to about 1000° C.

4. The deposition method of claim 1 wherein the lines of the feature have a line width of about 40 nm or less.

5. The deposition method of claim 4 wherein the lines of the feature have an aspect ratio of about 10 or more.

6. The deposition method of claim 1 wherein the liner layer is substantially conformal over the feature of the semiconductor substrate.

7. The deposition method of claim 1 wherein the liner layer is solider than the dielectric film.

8. The deposition method of claim 7 wherein the dielectric film is a flowable dielectric material.

9. The deposition method of claim 1 wherein the liner layer has a thickness between about 2 nm and about 10 nm on a sidewall of the lines of the feature.

10. The deposition method of claim 1 wherein the stress is between about 50 MPa and about 500 MPa.

11. A method for preventing a semiconductor structure from bending during a dielectric deposition, the method comprising:
    forming a liner layer over the semiconductor structure on a semiconductor substrate in a chamber, wherein the semiconductor structure includes lines having a line width of about 40 nm or less and an aspect ratio of about 10 or more;
    releasing a stress of the liner layer over the semiconductor structure by idling the liner layer in the chamber at a temperature of between about 450° C. to about 550° C. to substantially reduce bending the lines of the semiconductor structure; and
    depositing a flowable dielectric film over the stress-released liner layer to substantially fill a gap of the semiconductor structure.

12. The method of claim 11 wherein releasing the stress of the liner layer includes idling the liner layer in the chamber for a predetermined time.

13. The method of claim 11 wherein releasing the stress of the liner layer includes annealing the liner layer with a temperature from about a room temperature to about 1000° C.

14. The method of claim 11 wherein the liner layer is substantially conformal over the feature of the semiconductor substrate.

15. The method of claim 11 wherein the liner layer has a thickness between about 2 nm and about 10 nm on a sidewall of the lines of the feature.

16. The method of claim 11 wherein the stress is between about 50 MPa and about 500 MPa.

17. A method of filling gaps between features on a semiconductor substrate with dielectric material, the method comprising:
    forming a liner layer over the features on the semiconductor substrate in a chamber, the features having a width of about 40 nm or less and an aspect ratio of about 10 or more and the liner layer having a thickness of between about 2 nm and about 10 nm on sidewalls of the features;
    annealing the liner layer by idling the liner layer in the chamber for a period of time at a temperature of between about 450° C. and 550° C.; and
    depositing a dielectric film over the liner layer to substantially fill the gaps between the features.

18. The method of claim 17 wherein the period of time is selected to reduce a stress of the liner layer.

* * * * *